(12) United States Patent
Machida et al.

(10) Patent No.: US 7,852,137 B2
(45) Date of Patent: Dec. 14, 2010

(54) NORMALLY-OFF ELECTRONIC SWITCHING DEVICE FOR ON-OFF CONTROL OF ELECTRIC CIRCUIT

(75) Inventors: Osamu Machida, Saitama (JP); Akio Iwabuchi, Saitama (JP)

(73) Assignee: Sanken Electric Co., Ltd. (JP)

( * ) Notice: Subject to any disclaimer, the term of this patent is extended or adjusted under 35 U.S.C. 154(b) by 63 days.

(21) Appl. No.: 12/343,081

(22) Filed: Dec. 23, 2008

(65) Prior Publication Data
US 2009/0167411 A1    Jul. 2, 2009

(30) Foreign Application Priority Data
Dec. 26, 2007    (JP)    ............... 2007-334074

(51) Int. Cl.
*H03K 17/687*    (2006.01)
(52) U.S. Cl. ............... 327/427; 327/434; 327/436; 327/437
(58) Field of Classification Search ........ 327/427, 327/434, 436, 437
See application file for complete search history.

(56) References Cited

U.S. PATENT DOCUMENTS

| | | | |
|---|---|---|---|
| 5,142,215 A * | 8/1992 | Mathison | 320/141 |
| 5,789,900 A * | 8/1998 | Hasegawa et al. | 320/132 |
| 6,670,790 B2 * | 12/2003 | Stellberger | 320/134 |
| 7,199,640 B2 * | 4/2007 | De Cremoux et al. | 327/427 |
| 7,245,175 B2 * | 7/2007 | Morita | 327/427 |
| 7,324,315 B2 * | 1/2008 | Harris | 361/58 |
| 7,369,387 B2 * | 5/2008 | Harris et al. | 361/103 |
| 7,492,566 B2 * | 2/2009 | Harris | 361/127 |

FOREIGN PATENT DOCUMENTS

WO    WO2004/114508 A1    12/2004

* cited by examiner

*Primary Examiner*—Kenneth B. Wells
(74) *Attorney, Agent, or Firm*—Woodcock Washburn LLP

(57) ABSTRACT

A device capable of bidirectional on-off switching control of an electric circuit. Included is a normally-on HEMT connected between a pair of terminals of the device. A normally-off MOSFET of relatively low antivoltage strength is connected between the HEMT and one of the pair of terminals, and another similar MOSFET between the HEMT and the other of the terminal pair. A diode is connected in inverse parallel with each MOSFET, and two other diodes are connected between the gate of the HEMT and the pair of terminals respectively. The switching device as a whole is normally off.

13 Claims, 9 Drawing Sheets

# NORMALLY-OFF ELECTRONIC SWITCHING DEVICE FOR ON-OFF CONTROL OF ELECTRIC CIRCUIT

CROSS REFERENCE TO RELATED APPLICATIONS

This application claims priority to Japanese Patent Application No. 2007-334074, filed Dec. 26, 2007.

BACKGROUND

This invention relates generally to electronic switches, and particularly to those which lend themselves to use as bidirectional, or alternating current (AC), switches for on-off control of a variety of electric circuits notably including matrix converters and AC power supplies.

Perhaps the most familiar example of AC switches is a bidirectional triode thyristor, better known as TRIAC (TRIode for Alternating Current). The TRIAC has the weakness that, once triggered, it remains conductive until the current flowing therethrough drops below a predetermined threshold voltage. It cannot possibly be turned off at a controllable point in an AC cycle.

Some bidirectional switching devices have been known which meet that requirement. One of them (shown in FIG. 1 of the drawings attached hereto) comprises two insulated-gate bipolar transistors (IGBTs) connected in inverse series with each other and two diodes connected in inverse parallel with the respective IGBTs. The two IGBTs are replaceable with insulated-gate field-effect transistors (IGFETs), junction gate field-effect transistors (JFETs), or bipolar transistors. A further known bidirectional switch is an inverse parallel connection of two IGBTs.

These prior art bidirectional switching circuits, all incorporating normally-off solid-state switches, are alike in being unnecessarily complex in construction and high in turn-on resistance and voltage. Moreover, being made from semiconducting silicon materials with relatively low bandgaps, such known devices are not so high in antivoltage strength as can be desired.

WO 2004/114508 (FIG. 2) teaches a bidirectional switching device expressly designed to defeat all the noted drawbacks of the more conventional devices above. This prior art device offers the benefits of greater simplicity in construction and a higher antivoltage strength, the latter being a result of the fact that its semiconductor switch, typically in the form of a high electron mobility transistor (HEMT), is made from a semiconducting compound such as, usually, nitride.

Offsetting these benefits is the fact that this prior art device as well as its HEMT switch is normally on, necessitating use of a complex and expensive gate control circuit capable of applying a negative potential to the gate terminal of the HEMT in order to turn it off. The prior art device also requires an overcurrent protector for precluding the flow of an excessive current when the circuit is powered on. Incidentally, as far as this applicant is aware, nitride and other compound semiconductor devices are still a fledgling art. It is difficult to make the HEMT switch of this prior art bidirectional switching device normally off with the semiconductor materials technology available today.

SUMMARY OF THE INVENTION

The present invention has as an object to provide a switching device that operates normally off solely by use of semiconductor materials that have already been developed and are reliable as such.

Another object of the invention is to improve the voltage-withstanding capability of the normally-off switching device of the kind defined.

Briefly, the invention may be summarized as a normally-off switching device suitable for use as a bidirectional switch for on-off control of electric circuits such as a matrix converter and alternating-current power supply, among other applications. The switching device comprises a pair of main terminals to be connected to an electric circuit to be placed under on-off switching control. The main terminals are connected to a normally-on main semiconductor switch which has a first and a second main electrode on a main semiconductor region, and gate means for controlling current flow between the first and the second main electrode through the main semiconductor region. A normally-off first auxiliary semiconductor switch has a first main electrode connected to a first of the pair of main terminals, a second main electrode connected to the first main electrode of the main semiconductor switch, and control means for controlling current flow between the first and the second main electrode of the first auxiliary semiconductor switch. The first auxiliary semiconductor switch is capable of withstanding voltages not less than the absolute value of the threshold voltage of the main semiconductor switch. A normally-off second auxiliary semiconductor switch has a first main electrode connected to a second of the pair of main terminals, a second main electrode connected to the second main electrode of the main semiconductor switch, and control means for controlling current flow between the first and the second main electrode of the second auxiliary semiconductor switch. The second auxiliary semiconductor switch is also capable of withstanding voltages not less than the absolute value of the threshold voltage of the main semiconductor switch. A first diode is connected in parallel with the first auxiliary semiconductor switch and oriented for conduction in response to a voltage applied in a first prescribed direction between the pair of main terminals. A second diode is connected in parallel with the second auxiliary semiconductor switch and oriented for conduction in response to a voltage applied in a second prescribed direction, opposite to the first prescribed direction, between the pair of main terminals. A first gate potential switch (e.g., diode or controllable semiconductor switch), capable of withstanding higher voltages than the first and the second diode, is connected between the first main terminal and the gate means of the main semiconductor switch for determination of a potential for the gate means, the first gate potential switch permitting conduction between the first main terminal and the gate means of the main semiconductor switch in response to a voltage applied in the second prescribed direction between the pair of main terminals. A second gate potential switch (e.g., diode or controllable semiconductor switch), which also is capable of withstanding higher voltages than the first and the second diode, is connected between the second main terminal and the gate means of the main semiconductor switch for determination of a potential for the gate mans, the second gate potential switch permitting conduction between the second main terminal and the gate means of the main semiconductor switch in response to a voltage applied in the first prescribed direction between the pair of main terminals, the second gate potential switch being capable of withstanding higher voltages than the first and the second diode.

As may have been noted from the foregoing summary, the switching device according to the invention is, as a whole, normally off despite use of the normally-on main semiconductor switch, thanks to the two normally-off auxiliary semiconductor switches between which is connected the main semiconductor switch. The normally-off switching device, capable of bidirectional switching operation, is free from the danger of causing a short at the time of startup.

When the device is off, the voltage between the pair of main terminals is borne by the pair of main electrodes of the main semiconductor switch, which must of course be capable of withstanding that voltage. The two auxiliary semiconductor switches, however, are required to withstand a voltage only equal to, or somewhat more than, the absolute value of the threshold voltage of the main semiconductor switch. The auxiliary semiconductor switches of such low antivoltage strength are also low in on-resistance and inexpensive to manufacture, and so, also, is the entire switching device.

The normally-on main semiconductor switch is readily and inexpensively manufacturable using the semiconductor materials known today.

The two normally-off auxiliary semiconductor switches are easily controllable in relation to the potentials of the two main terminals, respectively.

The two normally-off auxiliary semiconductor switches are controllable in a variety of ways for deriving as many different modes of operation from the switching device.

The above and other objects, features and advantages of this invention will become more apparent, and the invention itself will best be understood, from a study of the following description and appended claims, with reference had to the attached drawings showing some pertinent prior art and the preferred embodiments of the invention.

DETAILED DESCRIPTION OF ILLUSTRATIVE EMBODIMENTS

Figure 1:
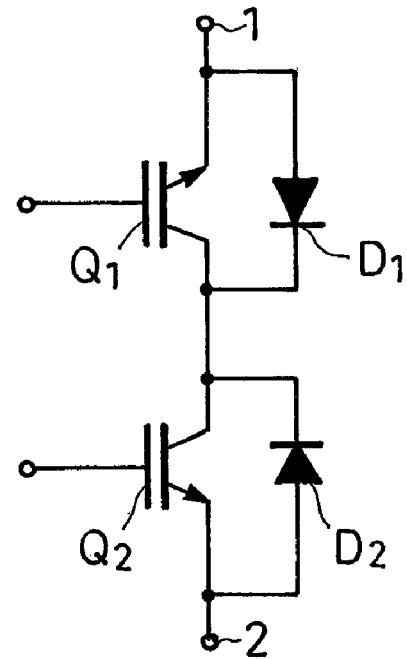
FIG. 1 is a schematic electrical diagram of a prior art bidirectional switching device.

The first cited prior art bidirectional switch is illustrated in FIG. 1 for a better understanding of the features and advantages of the instant invention. It has two IGBTs $Q_1$ and $Q_2$ connected in inverse series with each other between a pair of terminals 1 and 2, and two diodes $D_1$ and $D_2$ connected respectively in inverse parallel with the IGBTs. This and other comparable prior art devices possess the drawbacks pointed out earlier herein.

Figure 2:
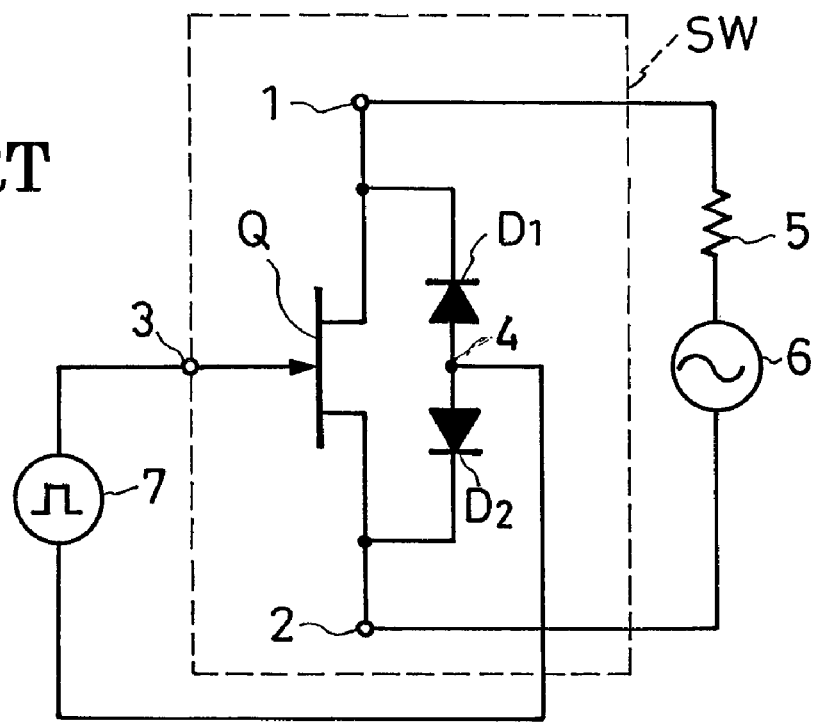
FIG. 2 is a schematic electrical diagram of another prior art bidirectional switching device bearing particular pertinence to the instant invention.

Given in FIG. 2 is the bidirectional switching device suggested by WO 2004/114508, supra, which is designed to overcome the drawbacks of the more conventional devices above. The prior art switching device SW includes a high electron mobility transistor (HEMT) or like normally-on compound semiconductor switch Q which is connected between a pair of main terminals 1 and 2 and which has a gate connected to a gate terminal 3. Also included are two diodes $D_1$ and $D_2$ having their anodes interconnected at 4. The first diode $D_1$ has its cathode connected to the first main terminal 1 whereas the second diode $D_2$ has its cathode connected to the second main terminal 2.

This prior art bidirectional switching device SW is to be put to use with a load 5 connected via an AC power supply 6 between the pair of main terminals 1 and 2. Also external to the switching device SW, a gate control circuit 7 for the normally-on compound semiconductor switch Q is to be connected between the gate terminal 3 and the junction 4 between the anodes of the diodes $D_1$ and $D_2$.

In the operation of the prior art bidirectional switching device SW, the normally-on compound semiconductor switch Q is off, and so is the bidirectional switching device SW, when the first main terminal 1 is higher in potential than the second main terminal 2 and, at the same time, when the gate terminal 3 is negative in potential with respect to the anode junction 4 of the diodes $D_1$ and $D_2$. The bidirectional switching device SW is of symmetrical design on both sides of the gate of the normally-on semiconductor switch Q. Consequently, the switch Q and therefore the complete device SW are also off when the second main terminal 2 is higher in potential than the first main terminal 1 and, at the same time, when the gate terminal 3 is negative in potential with respect to the anode junction 4 of the diodes $D_1$ and $D_2$. The Switch Q turns on, and so does the complete device SW, when the potential of the gate terminal 3 rises above (e.g., either zero or some positive value) the threshold voltage of the switch Q with respect to the potential of the anode junction 4 of the diodes $D_1$ and $D_2$.

Despite its admitted advantages over the more conventional contrivances of the type shown in FIG. 1, this prior art device is still too bulky and too costly to manufacture because of use of the normally-on switch Q. Since this switch Q and the complete device SW are both normally on, the gate control circuit 7 must be of complex, expensive design capable of imparting a negative potential to the gate terminal 3 in order to turn the device on. The prior art device also requires as aforesaid an overcurrent protector circuit for precluding the flow of an excessive current when the circuit is powered on.

All these drawbacks of the prior art are totally absent from the switching device according to the present invention, which will be disclosed in detail hereinbelow in terms of several preferred forms. Concerning the antivoltage strengths of the various components of the switching device according to the invention, the terms of relativity such as "higher" and "lower," and "more" and "less," as used in the following description of the preferred embodiments and in the claims appended hereto, refer to the absolute values of the voltages concerned, unless otherwise noted specifically.

Embodiment of FIGS. 3-9

Figure 3:
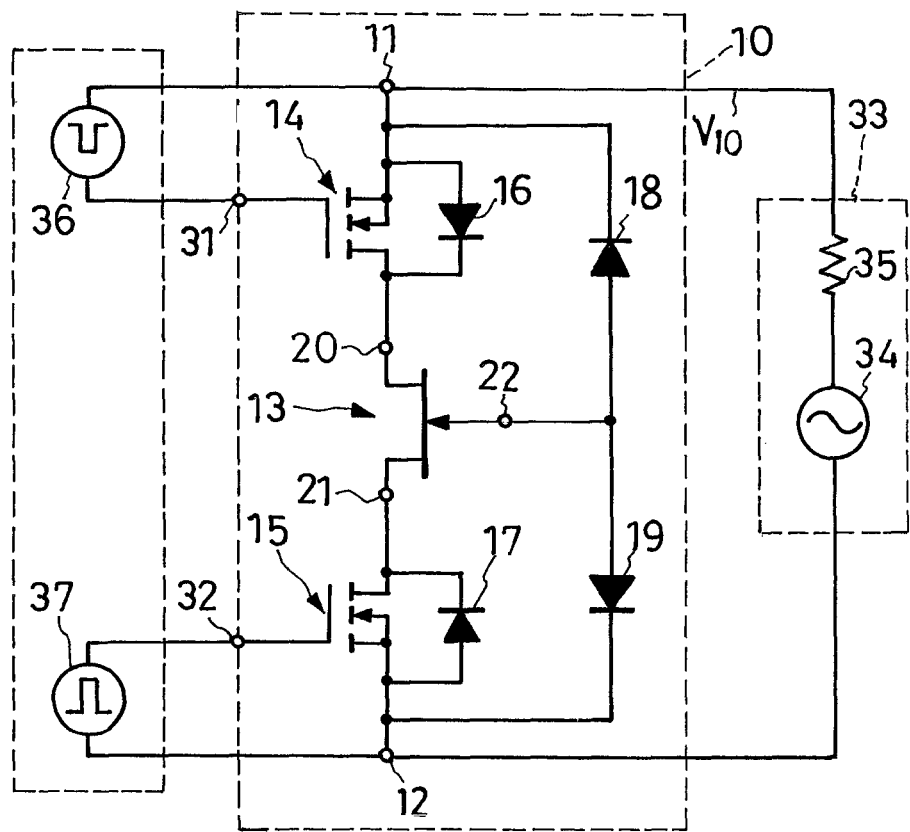
FIG. 3 is a schematic electrical diagram of a bidirectional switching device embodying the novel concepts of this invention, the bidirectional switching device being shown together with gate control circuits for gating control of the two normally-off auxiliary semiconductor switches of the device and an electric circuit under the on-off switching control of the device.

The first preferred embodiment of the invention is shown in FIG. 3 in terms of a bidirectional, semiconductor switching device 10. The representative device 10 comprises:

1. A pair of main terminals 11 and 12 to be connected to an electric circuit to be placed under bidirectional switching control of the device 10.

2. A normally-on, relatively high-antivoltage-strength main semiconductor switch 13 of semiconductor compound material shown as a high electron mobility transistor (HEMT).

3. A first normally-off auxiliary semiconductor switch 14 of semiconducting silicon material, shown as an insulated-gate field-effect transistor (IGFET) or metal-oxide-semiconductor field-effect transistor (MOSFET), connected between the first main terminal 11 and the main semiconductor switch 13 and having a capability of withstanding voltages not less than the absolute value of the threshold voltage of the main semiconductor switch 13.

4. A second normally-off auxiliary semiconductor switch 15 of semiconducting silicon material, also shown as an IGFET, connected between the second main terminal 12 and the main semiconductor switch 13 and having a capability of withstanding voltages not less than the absolute value of the threshold voltage of the main semiconductor switch 13.

5. Two diodes 16 and 17 connected in inverse parallel with the auxiliary semiconductor switches 14 and 15, respectively.

6. Two other diodes (or gate potential switches) 18 and 19 for determination of the gate potential of the main semiconductor switch 13.

The main semiconductor switch 13 of HEMT form has a pair of main electrodes 20 and 21 and a gate electrode 22. The main semiconductor switch 13 need not necessarily be a HEMT but may be other similar devices or a metal semiconductor field-effect transistor or the like. The main semiconductor switch 13 is made from semiconducting nitrides for the required relatively high antivoltage strength, as set forth in more detail hereinbelow.

Figure 4:
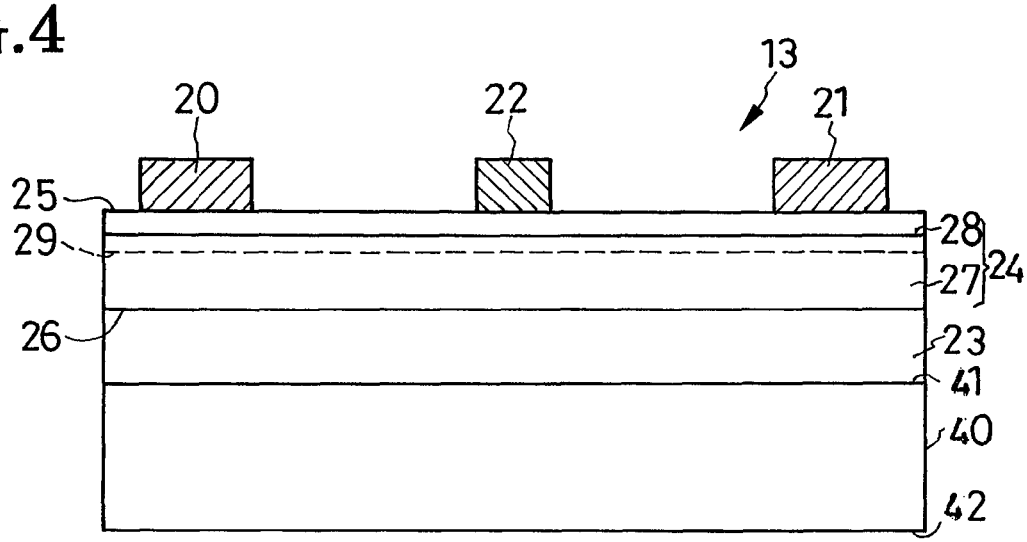
FIG. 4 is a diagrammatic sectional illustration of the normally-on main semiconductor switch of the bidirectional switching device of FIG. 3.

FIG. 4 is an illustration of an example of HEMT of which the main semiconductor switch 13 may take the form in practice. It has a substrate 40 on which there are grown by epitaxy a buffer 23 and, thereon, a main semiconductor region 24 constituting the primary part of the HEMT. The two main electrodes 20 and 21 and gate electrode 22 of the DEMT are all formed on the main semiconductor region 24.

Having a pair of opposite major surfaces 41 and 42, the substrate 40 provides a basis for epitaxial growth of the buffer 23 and main semiconductor region 24 on its first major surface 41, as well as a mechanical support for these parts. From a viewpoint of economy in manufacturing cost, the substrate 40 is made from monocrystalline electroconductive silicon in this embodiment, although it might also be made from a semiconductor such as silicon carbide or from an insulator such as sapphire or ceramics.

The buffer 23 is formed by growing a semiconducting nitride in vapor phase on the major surface 41 of the substrate 40 by any known or suitable method such as metalorganic chemical vapor deposition (MOCVD) also known as metalorganic vapor phase epitaxy (MOVPE). In practice the buffer 27 may be either mono- or multi-layered. The multilayer option may comprise, for example, a desired number of alternations of an aluminum nitride (AlN) layer and a gallium nitride (GaN) layer. However, being not too closely associated with the operation of this main semiconductor switch 13, the buffer 23 is eliminable. The AN and GaN layers are replaceable by other semiconducting nitrides or Groups III-V compounds.

The main semiconductor region 24 is a lamination of a first semiconductor layer 27 and a second semiconductor layer 28. Since the main semiconductor switch 13 is a HEMT in this embodiment, the first semiconductor layer 27 will be hereinafter referred to as the electron transit layer, and the second semiconductor layer 28 as the electron supply layer. The main semiconductor region 12 as a whole has a first major surface 25 facing away from the substrate 40 and a second major surface 26 held against the buffer 23.

Directly overlying the buffer 23 is the electron transit layer 27 which is made by MOCVD from an undoped semiconducting nitride, preferably gallium nitride, to a thickness of, say, 0.3-25.0 micrometers. As indicated by the broken line labeled 29, the electron transit layer 27 provides, in coaction with the overlying electron supply layer 28 yet to be detailed, what is known in the art as a two-dimensional electron gas (2DEG) layer along the heterojunction therebetween as the channel parallel to the major surface 25 of the main semiconductor region 24.

The semiconducting nitrides adoptable for the electron transit layer 27 are generally defined as: $Al_３In_bGa_{1-a-b}N$ where the subscripts a and b are both numerals that are equal to or greater than zero and less than one. Other semiconducting compounds might be employed for the electron transit layer 27 as well.

The electron supply layer 28 is of another semiconducting nitride deposited on the electron transit layer 27 by MOCVD to a thickness of 25 nanometers or more broadly 5-100 nanometers. The semiconducting nitrides for the electron supply layer 28 are greater in bandgap, and less in lattice constant, than those for the underlying electron transit layer 27. The particular material employed for the electron supply layer 28 in this embodiment is undoped $Al_{0.3}Ga_{0.7}N$.

Broadly, however, the electron supply layer 28 may be made from any of the semiconducting nitrides that are generally expressible by the formula: $Al_xIn_yGa_{1-x-y}N$ where the subscript x is a numeral that is greater than zero and less than one, and the subscript y is a numeral that is equal to or greater than zero and less than one. Preferably, x is in the range of 0.1-0.4, most desirably 0.3. Alternatively, the electron supply layer 28 may be made from n-doped $Al_xIn_yGa_{1-x-y}N$ or from semiconducting nitrides of different compositions or from other semiconducting compounds.

The pair of main electrodes 20 and 21 of the main semiconductors switch 13 are formed in spaced-apart positions on the surface 25 of the main semiconductor region 24 in ohmic contact therewith. The first main electrode 20 functions as drain when the first main terminal 11 of the bidirectional switching device 10 is higher in potential than the second main terminal 12, and as source when the first main terminal 11 is less in potential than the second main terminal 12. The second main electrode 21 functions as source when the first main terminal 11 is higher in potential than the second main terminal 12, and as drain when the first main terminal 11 is less in potential than the second main terminal 12.

The pair of main electrodes 20 and 21 are both made from a metal or metals, preferably a lamination of titanium and aluminum layers, that are capable of ohmic (low resistance) contact with the main semiconductor region 24. It is understood that the electron supply layer 28 of the main semiconductor region 24 is so thin that its electrical resistance is negligibly small in its thickness direction. The main electrodes 20 and 21 are therefore practically electrically coupled to the 2DEG layer 29 via the electron supply layer 28.

For gating the current flow between the two main electrodes 20 and 21 of the main semiconductor switch 13, the gate electrode 22 is positioned intermediate these electrodes on the surface 25 of the main semiconductor region 24 in Schottky contact therewith. The gate electrode 22 is also metal made, preferably in the form of a lamination of nickel and gold layers or of platinum and gold layers.

The gate electrode 22 is positioned at the midpoint between the pair of main electrodes 20 and 21, with equal spacings from both main electrodes, in this embodiment. However, within limits tolerable for the main semiconductor switch 13 to possess practically the required antivoltage strengths in both directions, the gate electrode 22 may be offset either way from the midpoint of the main electrodes 20 and 21. For most practical purposes the spacing between the gate electrode 22 and either of the first and second main electrodes 20 and 21 may be from about −20% to about +20% of the spacing between the gate electrode and the other of the two main electrodes.

When the first main terminal 11 of the bidirectional switching device 10 is higher in potential than the second main terminal 12, that is, during application of a positive voltage, the antivoltage strength of the main semiconductor switch 13 depends upon the spacing between first main electrode 20 and gate electrode 22. Conversely, when the first main terminal 11 is less in potential than the second main terminal 12, that is, during application of a negative voltage, the antivoltage strength of the main semiconductor switch 13 depends upon the spacing between second main electrode 21 and gate electrode 22. It therefore follows that in those applications of the invention in which the expected maximum positive and negative voltages to be applied between the pair of main electrodes 11 and 12 are equal, the gate electrode 22 may be positioned midway between the pair of main electrodes 20 and 21.

In the main semiconductor switch 13, which is in HEMT form in this embodiment of this bidirectional switching device 10, the two constituent semiconductor layers 27 and 28 of the main semiconductor region 24 provide a heterojunction therebetween. The second semiconductor layer 28 is therefore subjected to piezoelectric depolarization in addition to spontaneous depolarization. The depolarizations of the second semiconductor layer 28 result in the appearance of the 2DEG layer 29 along the interface between the semiconductor layers 27 and 28.

The 2DEG layer 29 has no hiatus created under the gate electrode 22 when this gate electrode is zero in potential with respect to either of the first and the second main electrode 20 and 21 that is functioning as source. The main semiconductor switch 13 is therefore normally on.

In order to turn off the main semiconductor switch 13 during application of a positive voltage (first main terminal 11 higher in potential than the second main terminal 12), the potential of the gate electrode 22 is dropped to a negative value (e.g., −5 volt) that is less than the threshold voltage of the switch 13, with respect to the second main electrode 21 functioning as source. Also, for turning off the main semiconductor switch 13 during application of a negative voltage, the potential of the gate electrode 22 is dropped to a negative value (e.g., −5 volt) that is less than the threshold voltage of the switch 13, with respect to the first main electrode 20 functioning as source. With the gate electrode 22 thus made negative in potential with respect to the source and less than the threshold voltage of the main semiconductor switch 13, electrons will disappear from that part of the first semiconductor layer 27 which underlies the gate electrode. A hiatus will then be created in the 2DEG layer 29, with consequent interception of current flow in either direction between the two main electrodes 20 and 21.

Referring back to FIG. 3, the first auxiliary semiconductor switch or MOSFET 14 of the bidirectional switching device 10 comprises a first main electrode or source connected to the first main terminal 11 of the device 10, a second main electrode or drain connected to the first main electrode 20 of the main semiconductor switch 13, and a gate electrode 31 as the control means. The second auxiliary semiconductor switch or MOSFET 15 comprises a first main electrode or source connected to the second main terminal 12 of the switching device 10, a second main electrode or drain connected to the second main terminal 21 of the main semiconductor switch 13, and a gate electrode 32 as the control means.

Both MOSFETs 14 and 15 are made from semiconducting silicon, are normally off, and withstand a voltage that is not less than the absolute value of the threshold voltage of the main semiconductor switch 13 and less than that withstood by the switch 13. The on-resistance of these MOSFETs is less than that of the main semiconductor switch 13. Other types of switching devices are adoptable for the two auxiliary semiconductor switches 14 and 15, such as IGFETs having a polycrystalline silicon gate, bipolar transistors, or insulated-gate bipolar transistors.

The first and second diodes 16 and 17 are connected in inverse parallel with the first and second MOSFETs 14 and 15, respectively. More precisely, the first diode 16 has its anode and cathode connected to the source and drain, respectively, of the first MOSFET 14. The second diode 17 has its anode and cathode connected to the source and drain, respectively, of the second MOSFET 15. These diodes 16 and 17 may be either discrete units or the parasitic diodes of the MOSFETs 14 and 15. Further the diodes 16 and 17 are replaceable with transistors and like solid-state switches having like functions.

The third and fourth diodes (gate potential switches) 18 and 19 both serve for determination of the gate potential of the main semiconductor switch 13. The third diode 18 has its anode connected to the gate electrode 22 of the main semiconductor switch 13 and its cathode connected to the first main terminal 11. The fourth anode 19 has its anode connected to the gate electrode 22 of the main semiconductor switch 13 and its cathode connected to the second main terminal 12. These diodes 18 and 19 are both approximately equal in antivoltage strength to the main semiconductor switch 13 and higher than the first and second diodes 16 and 17.

The third diode 18 is replaceable by a transistor or like controllable solid-state switch that conducts upon application of a negative voltage between the pair of main terminals 11 and 12. The control terminal (e.g., base) of that controllable switch may then be connected to the first terminal 11 either directly or via a resistor. The fourth diode 19 may likewise be replaced by a transistor or other controllable solid-state switch that conducts upon application of a positive voltage between the pair of main terminals 11 and 12. The control terminal (e.g., base) of that controllable switch may then be connected to the second terminal 12 either directly or via a resistor.

The pair of main terminals 11 and 12 of the switching device 10 are shown connected to the external electric circuit 33 which is under the bidirectional on-off switching control of the device. The electric circuit 33 is shown simplified as a combination of an AC power supply 34 and load 35.

FIG. 3 also depicts two gate control circuits 36 and 37 for on-off control of the two auxiliary semiconductor switches or MOSFETs 14 and 15. The first gate control circuit 36 is connected between the first main terminal 11 of the switching device 10 and the gate electrode 31 of the first MOSFET 14. The second gate control circuit 37 is connected between the second main terminal 12 of the switching device 10 and the gate electrode 32 of the second MOSFET 15.

Operation of the FIGS. 3-9 Embodiment

Figure 7:
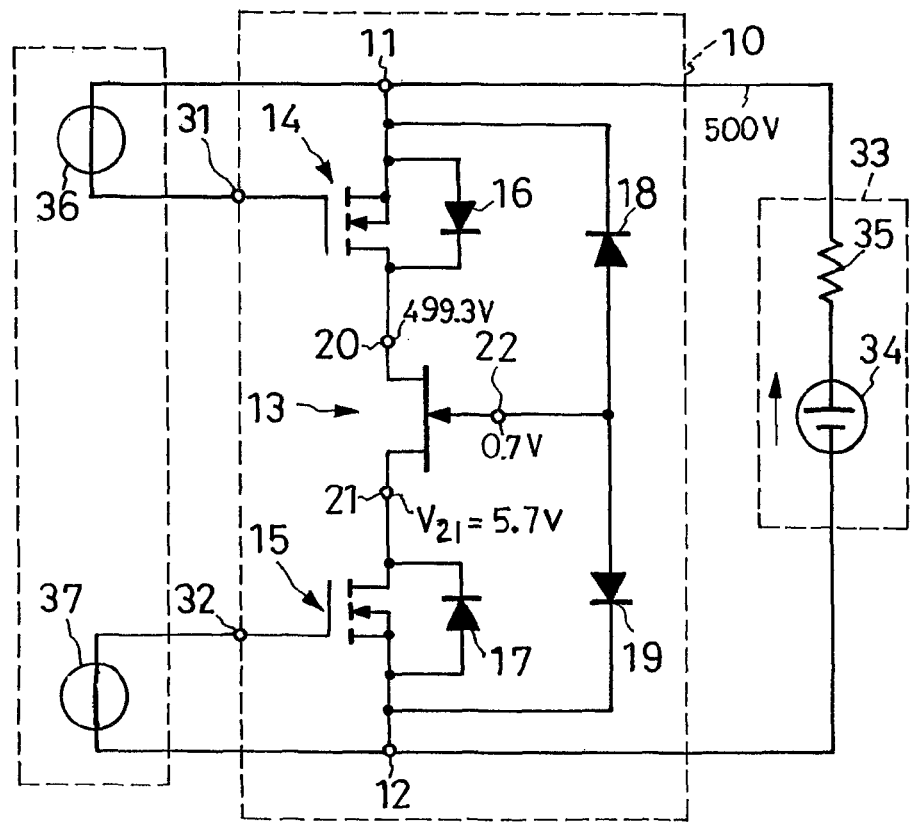
FIG. 7 is a diagram similar to FIG. 3 but explanatory of the operation of the FIG. 3 circuitry when the switching device is gated off while a positive voltage is being applied.
Figure 8:
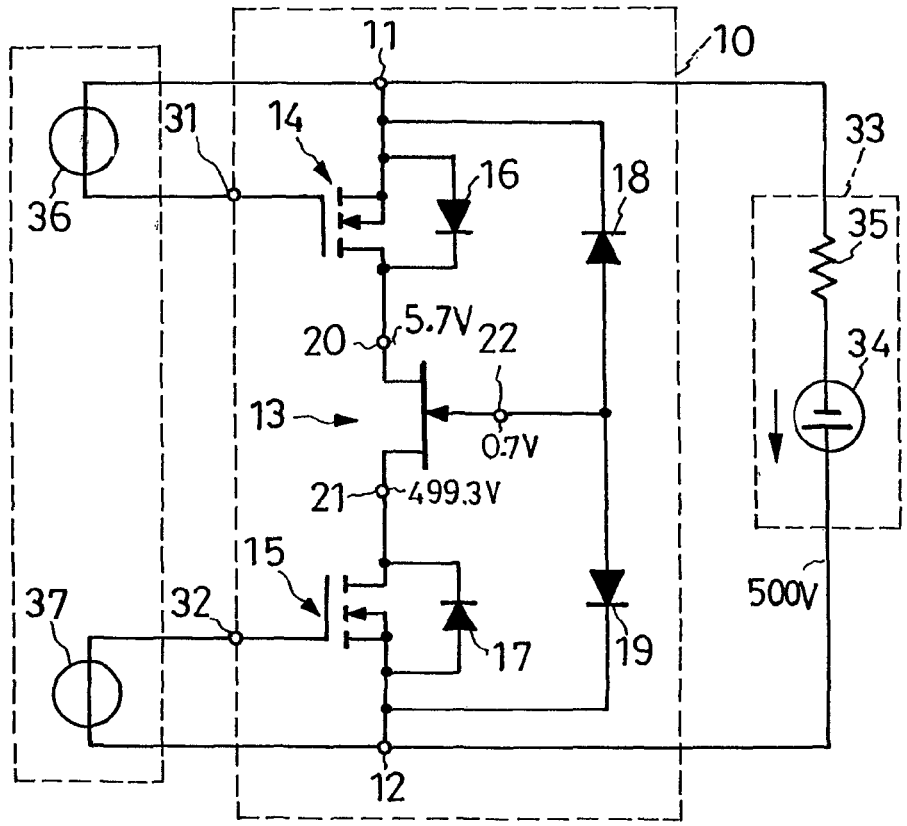
FIG. 8 is a diagram similar to FIG. 3 but explanatory of the operation of the FIG. 3 circuitry when the switching device is gated off while a negative voltage is being applied.
Figure 9:
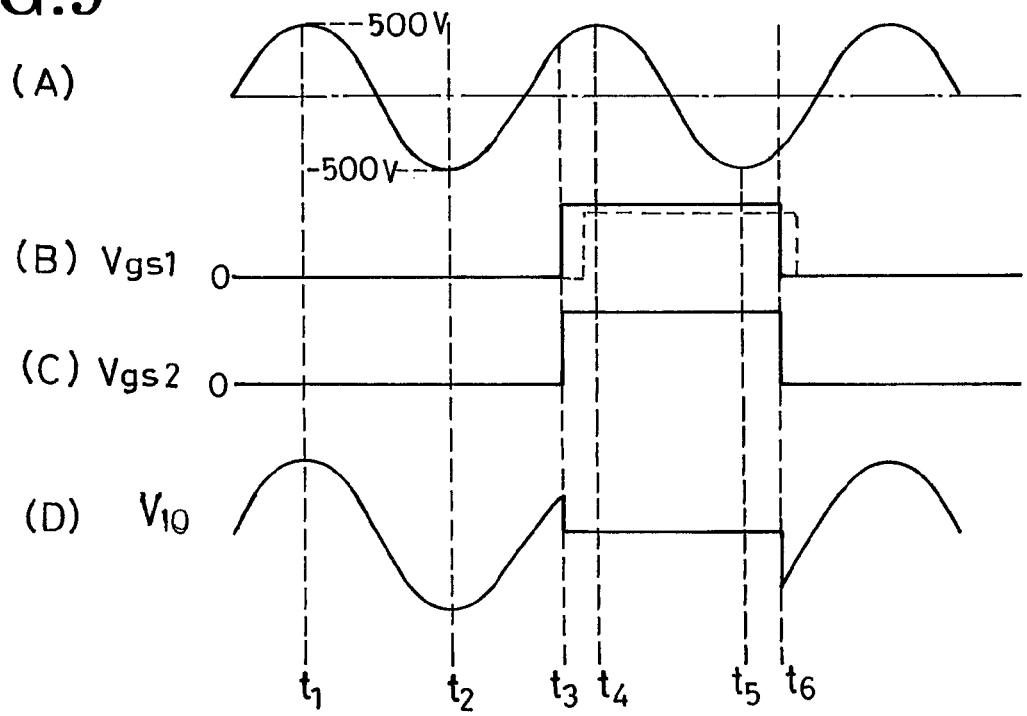
FIG. 9, consisting of (A) through (D), is a diagram of waveforms appearing at various parts of the FIG. 3 circuitry.

FIGS. 5-9 are explanatory of the operation of the bidirectional switching device 10 of FIG. 3. A brief study of FIG. 9, showing the waveforms appearing at various parts of the FIG. 3 circuitry, will conduce to an easier understanding of the subsequent operational description of the device 10 with reference to FIGS. 5-8.

FIG. 9 indicates at (A) the output voltage of the AC power supply 34 of the electric circuit 33 connected to the pair of main terminals 11 and 12 of the switching device 10; at (B) and (C) the first and second gate control signals $V_{gs}1$ and $V_{gs}2$ applied respectively to the first and second MOSFETs 14 and 15; and at (D) the main terminal voltage $V_{10}$ of the switching device 10. Also, in FIG. 9, the switching device 10 is on from $t_3$ to $t_6$ and off at other than this period.

Thus, as will be understood from (B) and (C) in FIG. 9, the MOSFET gate control signals $V_{gs}1$ and $V_{gs}2$ are high from $t_3$ to $t_6$ and low (zero volt) at other times. The AC voltage 34 from the source 34 is shown at (A) in FIG. 9 as being sinusoidal in waveform, with a positive peak of 500 volts and a negative peak of −500 volt. The two MOSFET gate control signals $V_{gs}1$ and $V_{gs}2$ need not be in phase as at (B) and (C) in FIG. 9; instead, the first gate control signal $V_{gs}1$ may lag behind the second as indicated by the dashed line at (B) in FIG. 9, or vice versa. The two gate control signals $V_{gs}1$ and $V_{gs}2$ may also differ in pulse duration.

Figure 5:
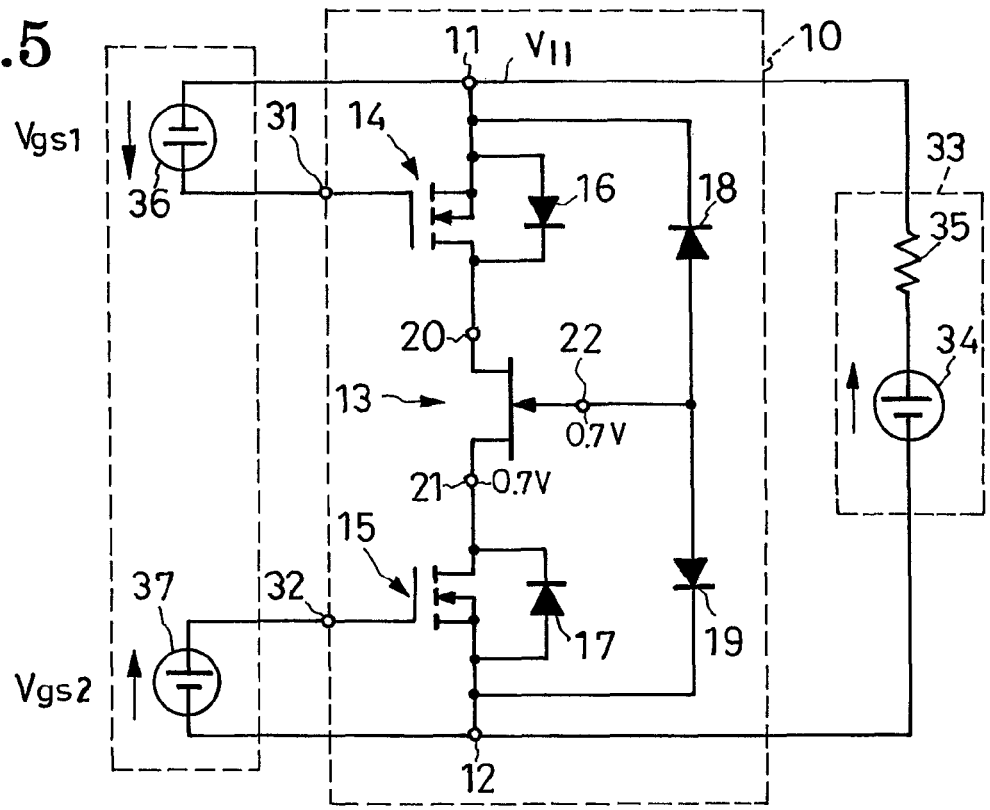
FIG. 5 is a diagram similar to FIG. 3 but explanatory of the operation of the FIG. 3 circuitry when the switching device is gated on while a positive voltage is being applied.

FIG. 5 is explanatory of what happens to the circuitry of FIG. 3 at the moment $t_4$ in FIG. 9 when the AC output voltage from the source 34 is at the peak (500V) of its positive half cycle. Also, at this moment $t_4$, the gate control signals $V_{gs}1$ and $V_{gs}2$ from the gate control signals 36 and 37 are both high, as at (B) and (C) in FIG. 9, holding both MOSFETs 14 and 15 on. Forward biased by the AC supply voltage, the first diode 16 is conductive.

Now, with continued reference to FIG. 5, let $V_{11}$ be the potential of the first main terminal 11 of the switching device 10. Then, if the voltage drop across the parallel connection of the first MOSFET 14 and first diode 16 is 0.7 V, the first main electrode 20 of the main semiconductor switch 13 will have a potential of $V_{11}$-0.7 V with respect to the second main terminal 12. If the voltage drop $V_{14}$ across the first MOSFET 14 during conduction thereof is less than the positive voltage across the first diode 16, the first main electrode 20 of the main semiconductor switch 13 will have a potential of $V_{11}$-$V_{14}$. Also, if the voltage drop across the second MOSFET 15 during conduction thereof is 0.7 volt, the second main electrode 21 of the main semiconductor switch 13 will have a potential of 0.7 V.

If the positive voltage across the fourth diode 19 is 0.7 V, for example, which is less than the sum of the voltage drop across the conducting second MOSFET 15 and the absolute value of the threshold voltage of the main semiconductor switch 13, then the potential difference between the second main electrode 21, functioning as source, and gate electrode 22 of the main semiconductor switch 13 will be zero. The normally-on main semiconductor switch 13 will then be on. Therefore, while the AC power supply 34 of the electric circuit 33 is generating a positive voltage, the current will flow along the path sequentially comprising the AC power supply 34, load 35, first main terminal 11 of the bidirectional switching device 10, first MOSFET 14 (or parallel connection of first MOSFET 14 and first diode 16), main semiconductor switch 13, second MOSFET 15, and second main terminal 12 of the bidirectional switching device 10.

Figure 6:
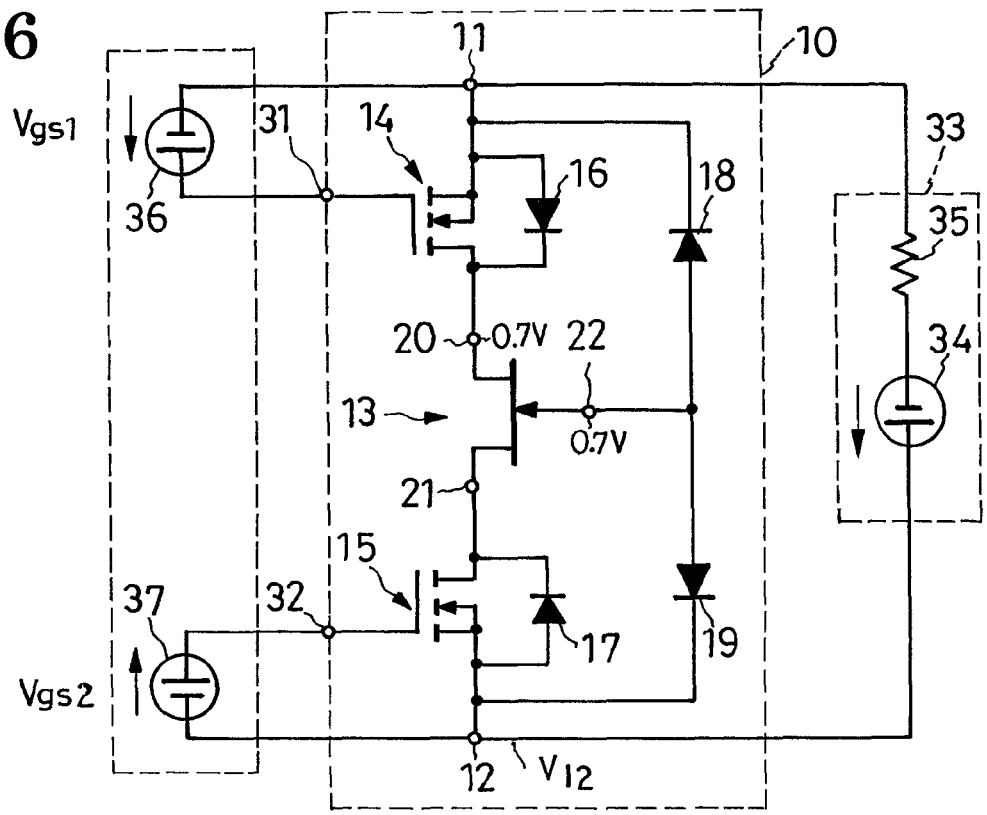
FIG. 6 is a diagram similar to FIG. 3 but explanatory of the operation of the FIG. 3 circuitry when the switching device is gated on while a negative voltage is being applied.

FIG. 6 indicates the operation of the circuitry of FIG. 3 at the moment $t_5$ in FIG. 9 when the AC supply voltage is at its negative peak (−500V). Also, at this moment $t_5$, the gate control signals $V_{gs}1$ and $V_{gs}2$ are both still high, as at (B) and (C) in FIG. 9, holding both MOSFETs 14 and 15 on. Let $V_{12}$ be the potential of the second main terminal 12 of the Switching device 10. Then, if the voltage drop across the parallel connection of the second MOSFET 15 and second diode 17 is 0.7 V, the second main electrode 21 of the main semiconductor switch 13 will have a potential of $V_{12}$-0.7 V. If the voltage drop $V_{15}$ across the second MOSFET 15 during conduction thereof is less than the positive voltage across the second diode 17, the second main electrode 21 of the main semiconductor switch 13 will have a potential of $V_{12}$-$V_{15}$. Also, if the voltage drop across the first MOSFET 14 is 0.7 V, the first main electrode 20 of the first semiconductor switch 13 will have a potential of 0.7 V with respect to the first main terminal 11 of the switching device 10.

If the positive voltage across the third diode 18 is 0.7 V, which is less than the sum of the voltage drop across the conducting first MOSFET 14 and the absolute value of the threshold voltage of the main semiconductor switch 13, then the gate electrode 22 will also have a potential of 0.7 V. Thus, since the potentials of the first main electrode 20, which is functioning as source, and gate electrode 22 of the main semiconductor switch 13 are both 0.7 V, the normally-off main semiconductor switch 13 will be held on.

FIG. 7 is a similar illustration of the FIG. 3 circuitry at the moment t1 in FIG. 9 when the AC output voltage from the source 34 is at the peak of its positive half cycle and when the switching device 10 is off. As will be observed from (B) and (C) in FIG. 9, the gate control signals V1 and $V_{gs}2$ from the gate control circuits 36 and 37 are then both zero, holding the MOSFETs 14 and 15 off.

If, in FIG. 7, the voltage drop across the first diode 16, which is being forward biased, is 0.7 V, and the voltage drop across the load 35 is zero, then the first main electrode 20 of the main semiconductor switch 13 will have a potential of 499.3 V. The fourth diode 19 is also forward biased at $t_1$. If the voltage drop across this fourth diode 19, subject to leak current from the third diode 18, is 0.7 V, the gate electrode 22 of the main semiconductor switch 13 will have a potential of 0.7 V with respect to the second main terminal 12 of the switching device 10.

The second diode 17 is reverse biased at $t_1$. Therefore, at this moment, there is only a minimal current flow, equivalent to the leak current of the second diode 17 at most, to the first main electrode 21 of the main semiconductor switch 13.

The voltage of the closed circuit constituted of the fourth diode 19, Schottky gate electrode 22 and second MOSFET 15 is defined as: $V_{19}-V_{th}-V_{21}=0$ where $V_{19}$ is the voltage across the fourth diode 19; $V_{th}$ is the threshold voltage of the main semiconductor switch 13; and $V_{21}$ is the voltage between the second main terminal 12 of the switching device 10 and the second main electrode 21, which is functioning as source, of the main semiconductor switch 13, that is, the drain-source voltage of the second MOSFET 15. From the above equation, if $V_{19}=0.7$ V, and $V_{th}-5$ V, then $0.7-(-5)-V_{21}0$, so that $V_{21}=5.7$ V.

Conversely, when the second main electrode 21, functioning as source, of the main semiconductor switch 13, has a potential of 5.7 V, the voltage between the gate electrode 22 and the source electrode will be less than the threshold voltage of the main semiconductor switch 13. The main semiconductor switch 13 will then turn off, and so will the switching device 10. At this juncture the voltage between the pair of main terminals 11 and 12 of the switching device 10 will be nearly wholly applied between the pair of main electrodes 20 and 21 of the main semiconductor switch 13, so that the second MOSFET 15 is then required to possess only a voltage not less than the absolute value of the threshold voltage of the main semiconductor switch 13. The second MOSFET 15 may therefore be of low on-resistance and low manufacturing cost, keeping the complete switching device 10 corresponding low in both respects.

FIG. 8 is a further similar illustration of the FIG. 3 circuitry at the moment $t_2$ in FIG. 9 when the AC supply voltage is at its negative peak. As will be noted from (B) and (C) in FIG. 9, the gate control signals $V_{gs}1$ and $V_{gs}2$ from the gate control circuits 36 and 37 are both zero at $t_2$ too, holding the MOSFETs 14 and 15 off. The switching device 10 is also off.

The second and third diodes 17 and 18 are both forward biased at $t_2$, causing a voltage drop of 0.7 V. Consequently, the second main electrode 21 of the main semiconductor switch 13 will have a potential of 499.3 V, and the gate electrode 22 that of 0.7 V. The first main electrode 20 of the main semiconductor switch 13 will have a potential of 5.7 V for the same reason as discussed above for the potential of the second main electrode 21 of the main semiconductor switch 13 with reference to FIG. 7. The potential of the gate electrode 22 of the main semiconductor Switch 13 will therefore be less than that of its first main electrode 20 functioning as source. The main semiconductor switch 13 and the entire switching device 10 will thus be off.

The switching device 10 of FIG. 3 may be put to use as either a forward or a backward diode. For use as a forward diode, the first MOSFET 14 may be turned off by the first gate control circuit 36, and the second MOSFET 15 on by the second gate control circuit 37. There will then be a current flow through the device 10 along the path sequentially comprising the first main terminal 11, first diode 16, main semiconductor switch 13, second MOSFET 15, and second main terminal 12 when the first main terminal 11 is higher in potential than the second 12, as at $t_1$ and $t_4$ in FIG. 9. On the other hand, when the second main terminal 12 is higher in potential than the first 11, as at $t_2$ and $t_5$ in FIG. 9, the first diode 16 will be reverse biased. The first MOSFET 14 and first diode 16 will then be both off, and so will be the device 10.

For use of the FIG. 3 device 10 as a backward diode, the first MOSFET 14 may be turned on by the first gate control circuit 36, and the second MOSFET 15 off by the second gate control circuit 37. The device 10 will then permit a current flow there through along the path sequentially comprising the second main terminal 12, second diode 17, first semiconductor switch 13, first MOSFET 14, and first main terminal 11 when the first main terminal 11 is less in potential than the second 12 as at $t_2$ and $t_5$ in FIG. 9. When the first main terminal 11 is higher in potential than the second 12, on the other hand, the second diode 17 will be reverse biased. The second MOSFET 15 and second diode 17 will both be off, and so will be the device 10.

Incidentally, the load 35 of the electric circuit 33 is shown as a resistor for illustrative convenience. The switching device 10 will operate by the principles set forth above with reference to FIGS. 5-8 irrespective of whether the load 35 is inductive, such as an electric motor or transformer, or capacitive, or if the electric circuit 33 is an inverter or the like.

The benefits offered by the switching device 10, described hereinbefore with reference to FIGS. 3-9, may be recapitulated as follows:

1. A normally-off bidirectional switching device is realized by a simple scheme of connecting the high-antivoltage-strength, normally-on main semiconductor switch 13 in series with a pair of lower-antivoltage-strength, normally-off, cheaper MOSFETs 14 and 15.

2. Constituted primarily of the normally-on, easy-to-fabricate, low-cost main semiconductor switch 13, the normally-on switching device 13 is manufacturable inexpensively.

3. Being normally off, the switching device 10 does not cause a short-circuiting when started up, making obsolete the antishort protector circuit that has been conventionally used with the prior art normally-on switching devices.

4. The MOSFETs 14 and 15 are both inexpensively made from silicon in order to keep the manufacturing cost of the switching device 10 at a minimum.

5. Being low in antivoltage strength, the MOSFETs 14 and 15 are low in on resistance as well, adding little to the on-resistance of the switching device 10.

6. Electrically coupled respectively to the main terminals 11 and 12, the gate control circuits 36 and 37 are simplified in construction.

7. With the MOSFETs 14 and 15 controlled in four different modes from the gate control circuits 36 and 37, the switching device 10 provides the four different circuit configurations of: (a) a short circuit between the pair of main terminals 11 and 12; (b) an open circuit between the pair of main terminals 11 and 12; (c) a forward diode between the pair of main terminals 11 and 12; and (d) a backward diode between the pair of main terminals 11 and 12. The switching device 10 may therefore be put to use with a wide variety of electric circuits, making itself mass-producible at reduced cost.

Figure 10:
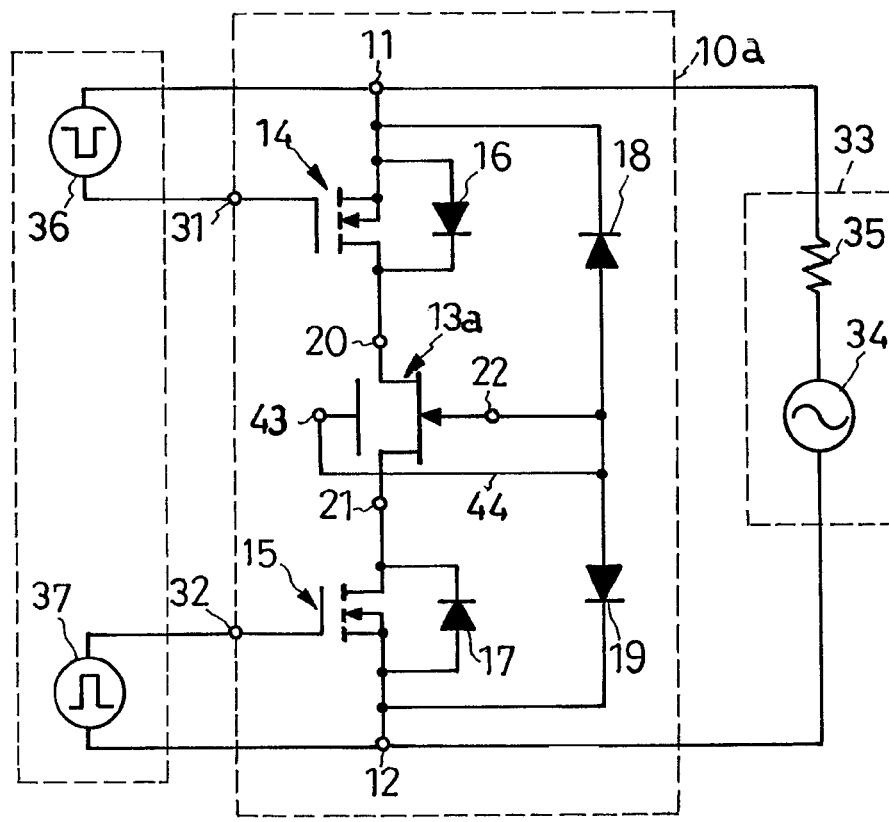
FIG. 10 is a schematic electrical diagram of another preferred form of switching device according to the invention, shown together with gate control circuits for gating control for the two normally-off auxiliary semiconductor switches of the device and an electric circuit under the on-off switching control of the device.
Figure 11:
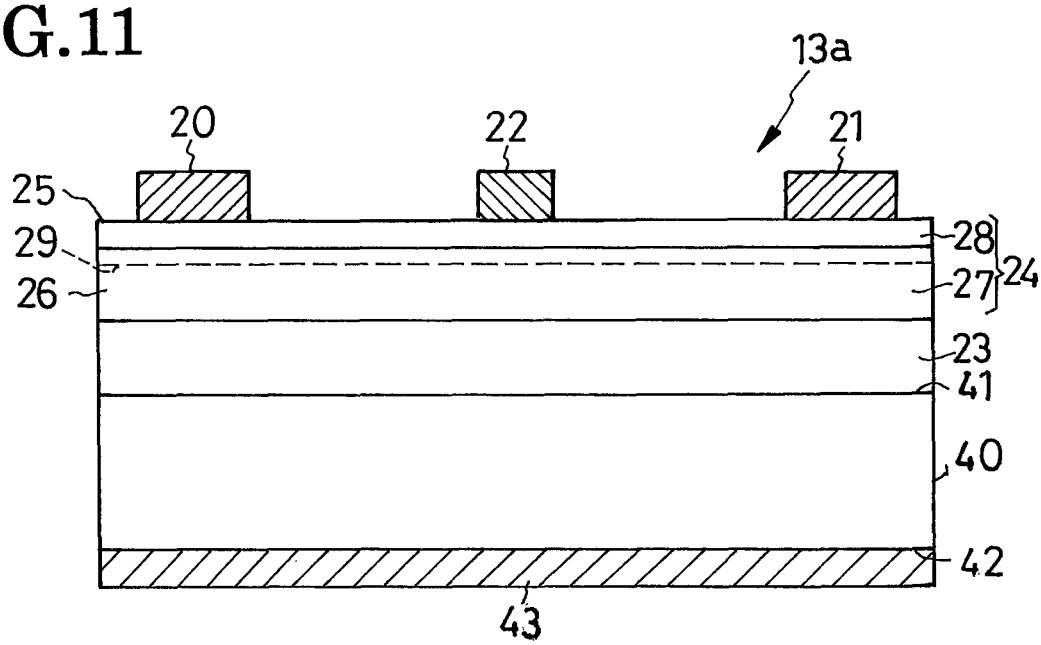
FIG. 11 is a diagrammatic sectional illustration of the normally-on main semiconductor switch of the switching device of FIG. 10.

Embodiment of FIGS. 10 and 11

The switching device $10_a$ shown in FIG. 10 features a modified main semiconductor switch $13_a$, all the other details of construction being as described above with reference to FIG. 3. The modified main semiconductor switch $13_a$ is similar to its FIG. 3 counterpart 13 except that, as illustrated in FIG. 11, a substrate electrode 43, also known as a back electrode, is affixed to the back or bottom surface 42 of the silicon substrate 40. The substrate electrode 43 is electrically connected to the gate electrode 22 by way of the conductor 44, FIG. 10.

This switching device $10_a$ gains the advantage, in addition to all those listed in conjunction with the preceding embodiment, that the substrate electrode 43 serves to stabilize the operation of the main semiconductor switch $13_a$, saving the device from current collapse.

Figure 12:
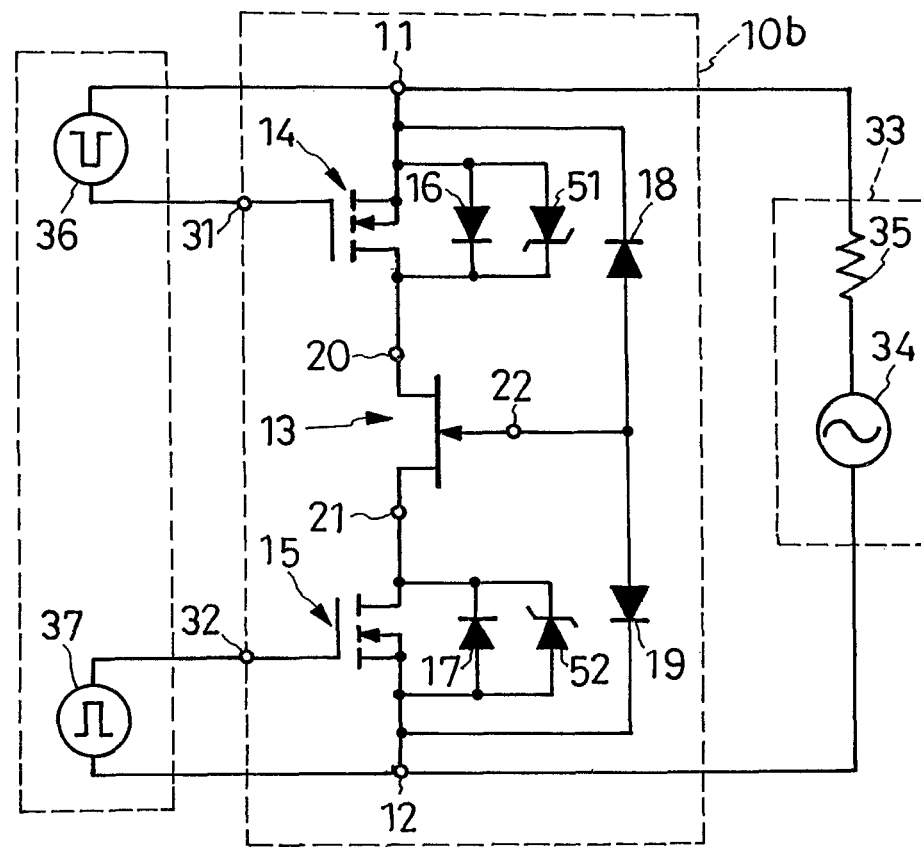
FIG. 12 is a schematic electrical diagram of still another preferred form of switching device according to the invention, shown together with gate control circuits for gating control for the two normally-off auxiliary semiconductor switches of the device and an electric circuit under the on-off switching control of the device.

Embodiment of FIG. 12

This switching device $10_b$ is akin to its FIG. 3 counterpart 10 except for the addition of two Zener diodes 51 and 52 by way of protection against overvoltages. These Zener diodes 51 and 52 are connected in inverse parallel with the MOSFETs 14 and 15, respectively. The first Zener diode 51 has a breakdown voltage, known as Zener voltage, that is less than the drain-source voltage of the first MOSFET 14 and more than the sum of the forward voltage of the third diode 18 and the threshold voltage $V_{th}$ of the main semiconductor switch 13. The second Zener diode 52 has a Zener voltage less than the drain-source voltage of the second MOSFET 15 and more than the sum of the forward voltage of the fourth diode 19 and the threshold voltage $V_{th}$ of the main semiconductor switch 13.

The Zener diodes 51 and 52 are to break down upon overvoltage application to the MOSFETs 14 and 15, protecting these devices from overvoltages. Other overvoltage protectors such as varistors and capacitors might be connected in parallel with the MOSFETs 14 and 15 in substitution for the Zener diodes 51 and 52.

Figure 13:
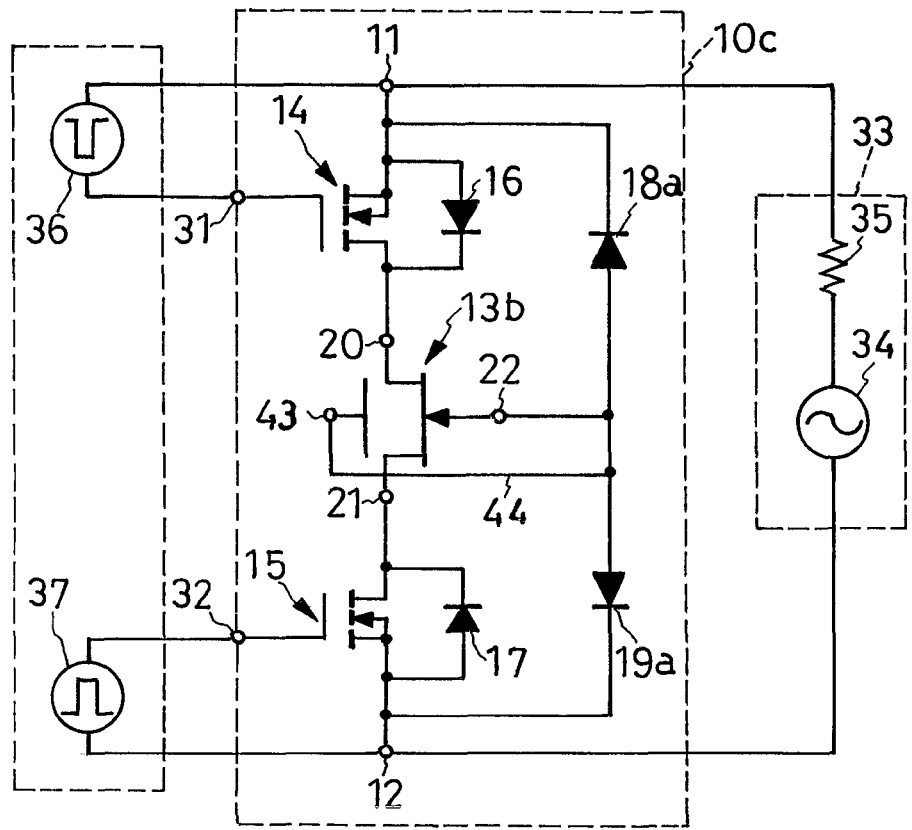
FIG. 13 is a schematic electrical diagram of a further preferred form of switching device according to the invention, shown together with gate control circuits for gating control for the two normally-off auxiliary semiconductor switches of the device and an electric circuit under the on-off switching control of the device.
Figure 14:
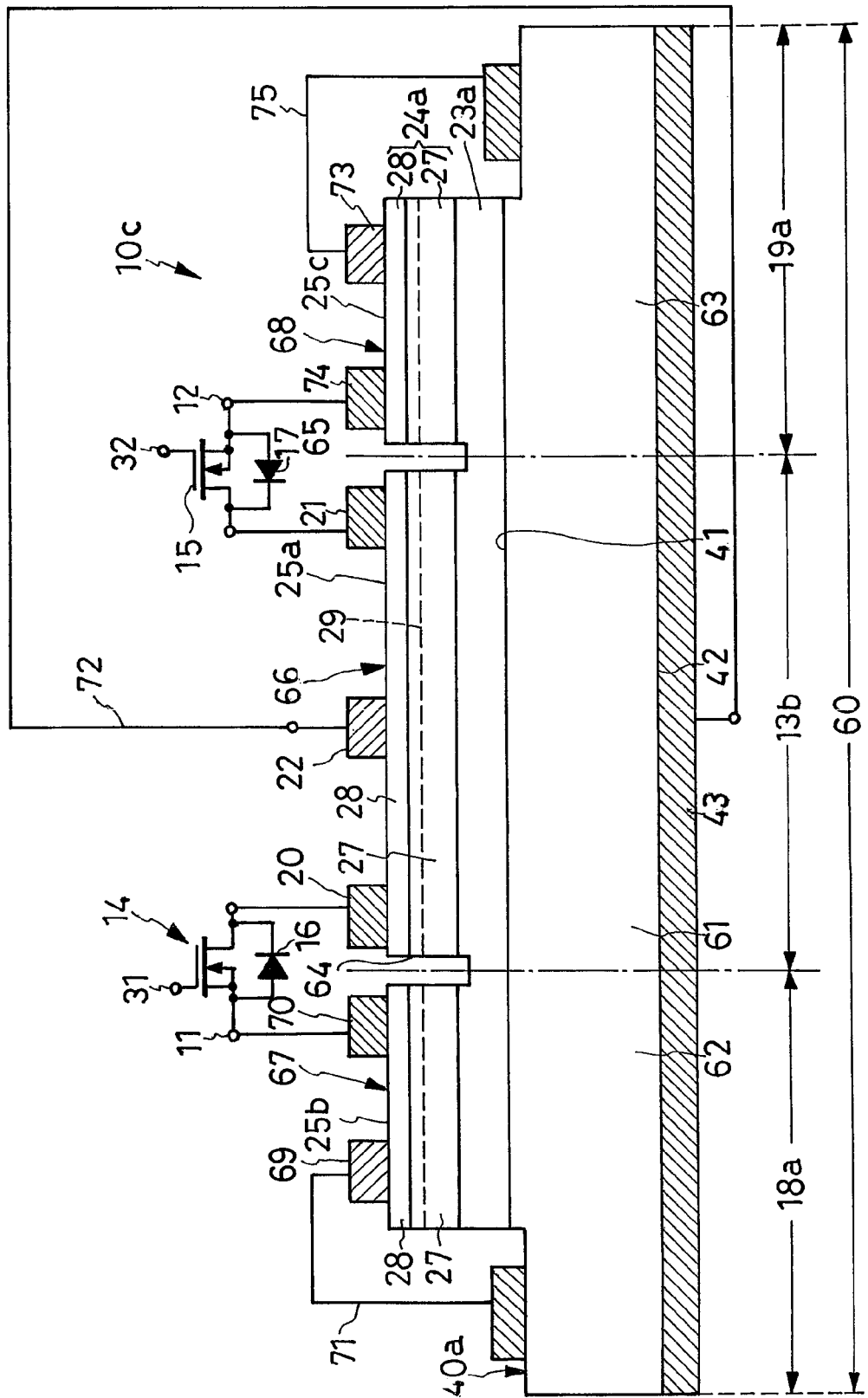
FIG. 14 is a diagrammatic sectional illustration of an integrated circuit chip comprising the main semiconductor switch and two diodes included in the switching device of FIG. 13, shown together with a schematic electrical diagram of the rest of the device.

Embodiment of FIGS. 13 and 14

The switching device $10_c$, of FIG. 13 incorporates a modified main semiconductor switch $13_b$ and modified third and fourth diodes $18_a$ and $19_a$ and is otherwise identical with its FIG. 10 counterpart $10_a$. Basically, the main semiconductor switch $13_b$ is of the same construction as that of FIG. 10, having the substrate electrode 43. The diodes $18_a$ and $19_a$ take the form of Schottky diodes which are capable of high speed operation. Grown on the same substrate as the main semiconductor switch $13_b$, these Schottky diodes $18_a$ and $19_a$ also create 2DEG layers, as will be explained hereinbelow in more detail.

The switching device $10_c$ is fabricated, in part, in the form of a monolithic, composite integrated circuit (IC) chip depicted in FIG. 14 and therein generally designated 60. The IC chip 60 has both main semiconductor switch $13_b$ of HEMT form and third and fourth diodes $18_a$ and $19_a$ of Schottky construction built on one and the same substrate $40_a$ of electroconductive, monocrystalline silicon. The substrate $40_a$ is shown as comprising a main switch section 61 for forming the main semiconductor switch $13_b$, and, on its opposite sides, a third diode section 62 and fourth diode section 63 for forming respectively the third and fourth diodes $18_a$ and $19_a$.

The substrate $40_a$ has a pair of opposite major surfaces 41 and 42. A main semiconductor region $24_a$ is formed on the first or top surface 41 of the substrate $40_a$ via a buffer $23_a$, and the substrate electrode 43 on the second or bottom surface 42 of the substrate. The buffer $23a$ has its material and thickness determined for practically maximum possible antivoltage strength in its thickness direction. The main semiconductor region $24_a$ is slitted at 64 and 65 and thereby electrically divided into a main switch section 66 and, on its opposite sides, a third diode section 67 and fourth diode section 68. Solid partitions of electrically insulating material could be employed in lieu of the slits 64 and 65. Each of the main switch section 66 and diode sections 67 and 68 of the main semiconductor region $24_a$ comprises a first semiconductor layer or electron transit layer 27 and second semiconductor layer or electron supply layer 28, which are akin to those designated by the same reference numerals in FIGS. 4 and 11.

The main switch section 66 of the main semiconductor region $24_a$ has formed on its surface $25_a$ the two ohmic main electrodes 20 and 21 and Schottky gate electrode 22 for providing the main semiconductor switch $13_b$.

The third diode section 67 of the main semiconductor region $24_a$ has formed on its surface $25_b$ a Schottky anode electrode 69 and ohmic cathode electrode 70 for providing the third diode $18_a$. The anode electrode 69 of the third diode $18a$ is connected by way of a conductor 71 to the electroconductive substrate $40_a$. Further, from this substrate $40a$, the anode electrode 69 of the third diode $18_a$ is electrically coupled to the gate electrode 22 of the main semiconductor switch $13_b$ via the substrate electrode 43 and conductor 72, as required in the circuit diagram of FIG. 13. The cathode electrode 70 of the third diode $18_a$ is connected to the first main terminal 11 of the switching device $10_c$.

The fourth diode section 68 of the main semiconductor region $24_a$ has formed on its surface $25_c$ a Schottky anode electrode 73 and ohmic cathode electrode 74 for providing the fourth diode $19_a$. For required connection to the gate electrode 22 of the main semiconductor switch $13_b$, the anode electrode 73 of the fourth diode $19_a$ is connected by way of a conductor 75 to the electroconductive substrate $40_a$ and thence, via the substrate electrode 43 and conductor 72, to the gate electrode 22 of the main semiconductor switch $13_b$. The cathode electrode 74 of the fourth diode $19_a$ is connected to the second main terminal 12 of the switching device $10_c$.

FIG. 14 further indicates the parallel circuit of first MOSFET 14 and first diode 16 connected between the first main terminal 11 of the switching device $10_c$ and the first main electrode 20 of the main semiconductor switch $13_b$, and the parallel circuit of second MOSFET 15 and second diode 17 connected between the second main terminal 12 of the switching device $10_c$ and the second main electrode 21 of the main semiconductor switch $13_b$.

Constructed as in the foregoing, the switching device $10_c$ of FIGS. 13 and 14 offers the following advantages, in addition to all those listed in connection with the embodiments of FIGS. 3 and 10:

1. The switching device $10_c$ is compact in size and simple and inexpensive in construction as the main switch $13_b$ and diodes $18_a$ and $19_a$ share the main semiconductor region $24_a$ grown on the same substrate $40_a$ via the buffer $23_a$.

2. Being both in the form of Schottky diodes taking advantage of the 2DEG in the main semiconductor region $24_a$, the diodes $18_a$ and $19_a$ have a high antivoltage strength and high operating speed.

3. The anodes 69 and 73 of the diodes $18_a$ and $19_a$ are easily connectable to the gate electrode 22 of the main semiconductor switch $13_b$, that connection being made through substrate $40_a$ and substrate electrode 43.

4. For the same reason as above, the substrate $40_a$ has its potential stabilized. The stable potential of the substrate $40_a$ leads to that of the surface $25_a$ of the main switch section 66 of the main semiconductor region $24_a$, resulting in reduction of current collapse.

The switching device $10_b$ of FIG. 12 could also be fabricated in the form of an IC chip similar to that of FIG. 14.

Figure 15:
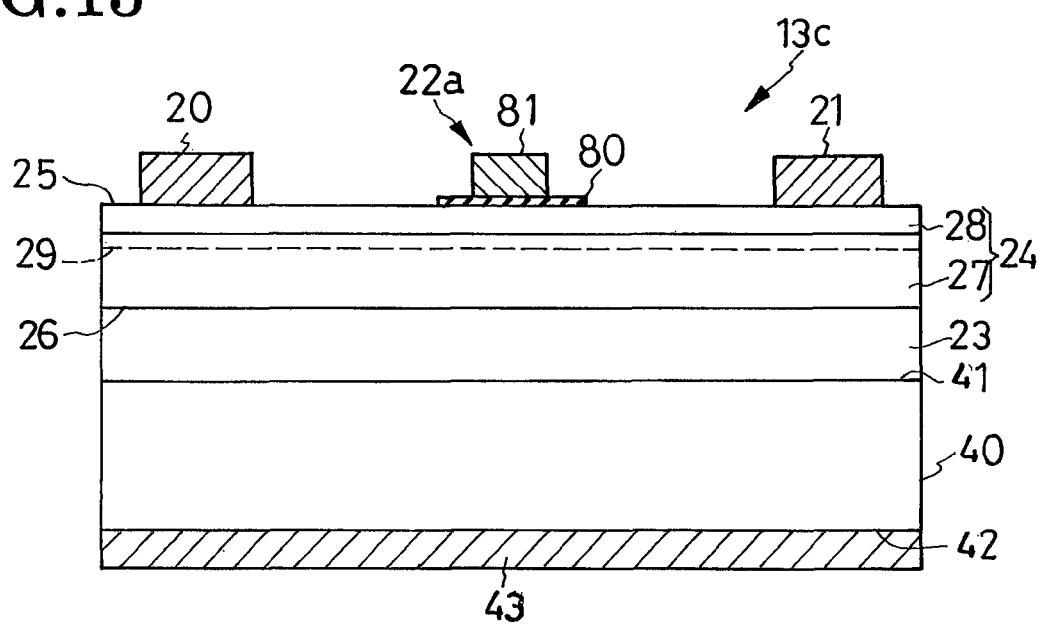
FIG. 15 is a diagrammatic sectional illustration of a further preferred form of main semiconductor switch for use in switching devices according to the invention.

Embodiment of FIG. 15

The main semiconductor switch $13_a$ of FIG. 11 is modifiable as in FIG. 15. The modified main semiconductor switch 13 has, in substitution for the gate electrode 22 of FIG. 11, gate means $22_a$ having a gate insulating film 80 of electrically insulating material through which a gate electrode 81 is seated against the surface 25 of the main semiconductor region 24. This main semiconductor switch $13_c$ is normally on. Therefore, when the gate electrode 81 becomes negative in potential with respect to either of the pair of main electrodes 20 and 21 that is functioning as source, the 2DEG layer 29 is intercepted under the field effect, turning the main semiconductor switch $13_c$ off.

The main semiconductor switch $13_c$ finds use in the switching devices 10, $10_a$ and $10_b$ of FIGS. 3, 10 and 12. The substrate electrode 43 is eliminable from the switch $13_c$ of FIG. 15. A similar gate-insulating film could be interposed between the gate electrode 22 of the main semiconductor switch $13_b$, FIG. 14, and the main switch section 66 of the main semiconductor region $24_a$.

Figure 16:
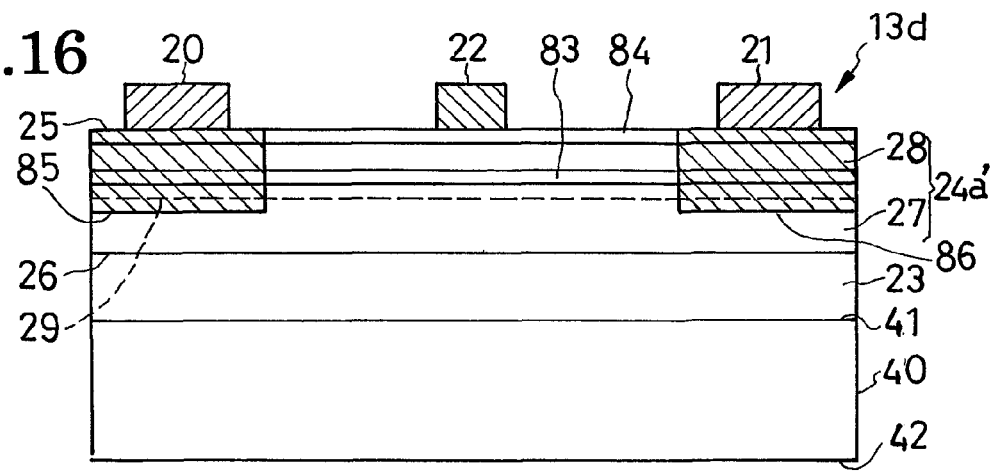
FIG. 16 is a diagrammatic sectional illustration of a further preferred form of main semiconductor switch for use in switching devices according to the invention.

Embodiment of FIG. 16

The main semiconductor region $24_a'$ of this main semiconductor switch $13_d$ contains some features that are absent from all the foregoing main semiconductor switches 13 and $13_a$-$13_c$. The modified main semiconductor region $24_a'$ comprises a spacer layer 83 and cap layer 84 in addition to the electron transit layer 27 and electron supply layer 28, the last two being present in the main semiconductor regions of all the main semiconductor switches disclosed previously. Interposed between electron transit layer 27 and electron supply layer 28, the spacer layer 83 is made from undoped aluminum nitride (AlN) or aluminum indium gallium nitride (AlInGaN). The spacer layer 83 serves to prevent a drop in electron mobility in the 2DEG layer 29. The cap layer 84, overlying the electron supply layer 28, is made from undoped aluminum gallium nitride (AlGaN) for surface charge control.

Additional features of this invention reside in contact regions 85 and 86 which are indicated by the hatchings for clarity. These contact regions 85 and 86 are formed by introducing an n-type impurity into those parts of the main semiconductor region $24_a'$ which immediately underlie the pair of main electrodes 20 and 21 of the main semiconductor switch $13_d$. The contact regions 85 and 86 function for reduction of contact resistance between the main electrodes 20 and 21 and the main semiconductor region $24_a'$.

This main semiconductor switch $13_d$ finds use in the bidirectional switching devices 10 and $10_b$ of FIGS. 3 and 12 in replacement of the switch 13, enabling these devices to gain the same benefits as set forth above. The teachings of this embodiment are applicable to the embodiments of FIGS. 11, 14 and 15 as well.

Figure 17:
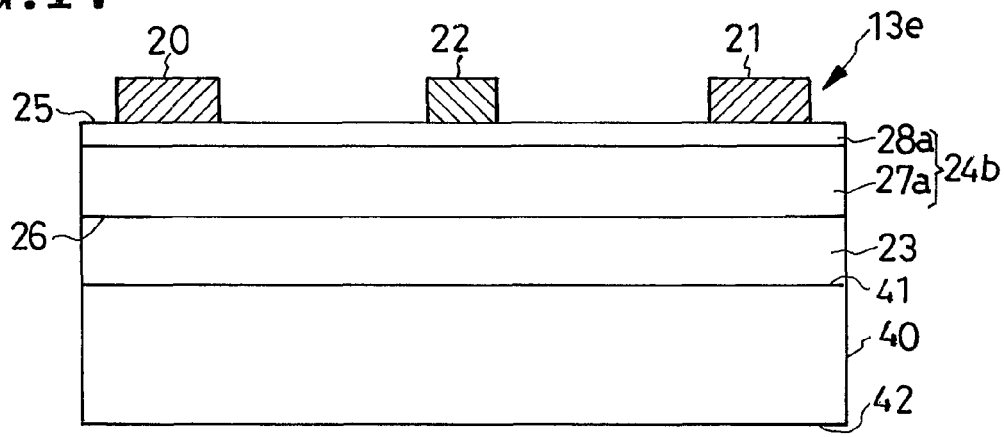
FIG. 17 is a diagrammatic sectional illustration of a further preferred form of main semiconductor switch for use in switching devices according to the invention.

Embodiment of FIG. 17

This main semiconductor switch $13_e$ has its main semiconductor region $24_b$ reconfigured into a normally-on metal semiconductor field effect transistor (MESFET). The main semiconductor region $24_b$ of this MESFET switch $13_e$ is a lamination of a first semiconductor layer $27_a$ of undoped GaN overlying the buffer 23, and a second semiconductor layer $28_a$ of n-type GaN formed by ion implantation of an n-type impurity (e.g., silicon) into an undoped GaN layer which has been formed as an extension of the first semiconductor layer $27_a$. The MESFET switch $13_e$ is similar to the HEMT switch 13, FIG. 4, in all the other details of construction.

It is the second semiconductor layer $28_a$ that provides the channel through the main semiconductor region $24_b$ in this normally-on MESFET switch $13_e$. Normally, when the Schottky gate electrode 22 of the MESFET switch $13_e$ is equal in potential to either of the two main electrodes 20 and 21 that is functioning as source, the channel through the second semiconductor layer $28_a$ is completed. This channel opens under the field effect when the gate electrode 22 becomes negative in potential with respect to either of the main electrodes 20 and 21 that is functioning as source.

It is therefore apparent that this normally-on MESFET switch $13_e$ lends itself to the same use as does the HEMT switch 13 in the bidirectional switching devices 10, FIG. 3, or $10_b$, FIG. 12. The switch $13_e$ is also substitutable for the HEMT switch $13_b$ of FIG. 14, in which case the third and fourth diodes $18_a$ and $19_a$ may be built on extensions of the second semiconductor layer $28_a$ of the switch $13_e$.

Figure 18:
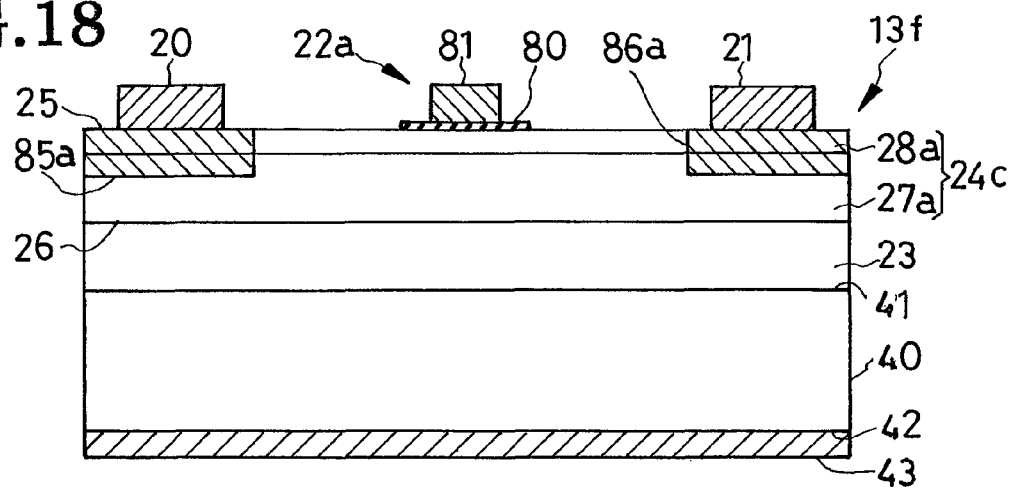
FIG. 18 is a diagrammatic sectional illustration of a still further preferred form of main semiconductor switch for use in switching devices according to the invention.

Embodiment of FIG. 18

This main semiconductor switch $13_f$ differs from its FIG. 17 counterpart $13_e$ in having gate means $22_a$ in place of the gate electrode 22 and a main semiconductor region $24_c$ in place of the main semiconductor region $24_b$ and in additionally comprising a substrate electrode 43. The gate means $22_a$ comprises a gate insulating film 80, and a gate electrode 81 positioned on the major surface of the main semiconductor region 24, via the gate insulating film 80. The main semiconductor region 24, is similar to that of FIG. 17 except for the pair of contact regions $85_a$ and $86_a$ formed therein in underlying relationship to the main electrodes 20 and 21. The contact regions $85_a$ and $86_a$ are similar to those shown in FIG. 16 and therein designated 85 and 86.

The main semiconductor switch $13_f$ finds use in the switching devices 10, $10_a$, $10_b$ and $10_c$ of FIGS. 3, 10, 12 and 13 in substitution for the main semiconductor switches 13, $13_a$ and $13_b$. The teachings of FIG. 18 are also applicable to the main semiconductor switch $13_b$ of the switching device $10_c$ of the IC chip form illustrated in FIG. 14.

Possible Modifications

Despite the foregoing detailed disclosure it is not desired that the present invention be limited by the exact showing of the drawings or the description thereof. The following is a brief list of possible modifications, alterations or adaptations of the illustrated embodiments which are all believed to fall within the purview of this invention:

1. The main semiconductor regions 24 and $24_a$-$24_c$ of the various embodiments disclosed herein could be made from semiconducting nitrides such as GaN, AlGaN, InGaN, AlInGaN, AlN, and InAlN, as well as derivatives thereof, from Groups III-V compound semiconductors such as AlP, GaP, AlInP, GaInP, AlGaP, AlGaAs, GaAs, AlAs, InAs, InP, InN, and GaAsP, from Groups II-VI compound semiconductors such as ZnO, or from other compound semiconductors.

2. The main semiconductor switches 13 and $13_a$-$13_f$ of the various embodiments disclosed herein could be furnished with a known field plate.

3. Each IC chip may contain a plurality of sets of main electrodes 20 and 21 and gate electrode 22 (or gate means $22_a$), with all such sets interconnected in parallel, instead of one set of such electrodes as in FIGS. 4, 11 and 14-18.

4. The second semiconductor layer 28 of the main semiconductor switches 13 and $13_a$-$13_d$ of HEMT configuration may be replaced by a hole supply layer of a p-type semiconductor. In that case a two-dimensional hole gas will be generated in place of the 2DEG layer 29. The term comprehending both electron gas and hole gas is "carrier gas."

5. The surface 25 of the main semiconductor regions 24 and $24_a$-$24_e$ is desirably flat but might have a recess formed under the gate electrode 22 or gate means $22_a$ as required.

6. The main semiconductor switches 13 and $13_a$-$13_f$ are desirably of the illustrated flat design, with both main electrodes 20 and 21 on the first major surface 25 of the main semiconductor region, but might be of the upstanding type with the two main electrodes on the first and the second major surface, respectively, of the main semiconductor region.

7. The main semiconductor switch is desirably either a HEMT or a MESFET but might be some other type of switch; for example, the main semiconductor switch 13 shown in FIG. 4 could take the form of a junction field-effect transistor.

What is claimed is:

1. A switching device suitable for use as a bidirectional switch for on-off control of electric circuits, the switching device comprising:
   (a) a first and a second main terminal to be connected to an electric circuit to be placed under on-off switching control of the device;
   (b) a normally-on main semiconductor switch comprising a main semiconductor region, a first and a second main electrode on the main semiconductor region, and gate means for controlling current flow between the first and the second main electrodes through the main semiconductor region, the main semiconductor switch having a prescribed threshold voltage;
   (c) a normally-off first auxiliary semiconductor switch comprising a first main electrode connected to the first main terminal, a second main electrode connected to the first main electrode of the main semiconductor switch, and control means for controlling current flow between the first and the second main electrodes of the first auxiliary semiconductor switch, the first auxiliary semiconductor switch being capable of withstanding voltages not less than the absolute value of the threshold voltage of the main semiconductor switch;
   (d) a normally-off second auxiliary semiconductor switch comprising a first main electrode connected to the second main terminal, a second main electrode connected to the second main electrode of the main semiconductor switch, and control means for controlling current flow between the first and the second main electrodes of the second auxiliary semiconductor switch, the second auxiliary semiconductor switch being capable of withstanding voltages not less than the absolute value of the threshold voltage of the main semiconductor switch;
   (e) a first diode connected in parallel with the first auxiliary semiconductor switch, the first diode being oriented for conduction in response to a voltage applied in a first prescribed direction between the first and the second main terminals;
   (f) a second diode connected in parallel with the second auxiliary semiconductor switch, the second diode being oriented for conduction in response to a voltage applied in a second prescribed direction, opposite to the first prescribed direction, between the first and the second main terminals;
   (g) a first gate potential switch connected between the first main terminal and the gate means of the main semiconductor switch for determination of a potential for the gate means, the first gate potential switch permitting conduction between the first main terminal and the gate means of the main semiconductor switch in response to a voltage applied in the second prescribed direction between the first and the second main terminal, the first gate potential switch being capable of withstanding higher voltages than the first and the second diode;
   (h) a second gate potential switch connected between the second main terminal and the gate means of the main semiconductor switch for determination of a potential for the gate means, the second gate potential switch permitting conduction between the second main terminal and the gate means of the main semiconductor switch in response to a voltage applied in the first prescribed direction between the first and the second main terminal, the second gate potential switch being capable of withstanding higher voltages than withstand voltages of the first and the second diode;
   (i) a first switch control circuit connected between the first main electrode and control means of the first auxiliary semiconductor switch for on-off control of the first auxiliary semiconductor switch; and
   (j) a second switch control circuit connected between the first main electrode and control means of the second auxiliary semiconductor switch for on-off control of the second auxiliary semiconductor switch.

2. A switching device as recited in claim 1, further comprising:
   (a) a first overvoltage protector connected in parallel with the first auxiliary semiconductor switch; and
   (b) a second overvoltage protector connected in parallel with the second auxiliary semiconductor switch.

3. A switching device as recited in claim 1, wherein the main semiconductor region of the main semiconductor switch has a major surface on which the first and the second main electrodes of the main semiconductor switch are disposed in spaced-apart positions and on which the gate means of the main semiconductor switch is disposed between the first and the second main electrodes.

4. A switching device as recited in claim 3, wherein the main semiconductor region of the main semiconductor switch comprises a first and a second semiconductor layer capable of conjointly creating a two-dimensional carrier gas layer as a channel between the first and the second main electrode of the main semiconductor switch.

5. A switching device as recited in claim 3, wherein the main semiconductor region of the main semiconductor switch includes a semiconductor layer of a prescribed conductivity type capable of providing a channel between the first and the second main electrodes of the main semiconductor switch.

6. A switching device as recited in claim 3, wherein the first and the second main electrodes of the main semiconductor switch are in ohmic contact with the main semiconductor region, and wherein the gate means of the main semiconductor switch includes a gate electrode in Schottky contact with the main semiconductor region.

7. A switching device as recited in claim 3, wherein the first and the second main electrodes of the main semiconductor switch are in ohmic contact with the main semiconductor region, and wherein the gate means of the main semiconductor switch comprises:
   (a) a gate insulating film of electrically insulating material; and
   (b) a gate electrode positioned on the major surface of the main semiconductor region via the gate insulating film.

8. A switching device as recited claim 3, further comprising:
   (a) a substrate of electroconductive material having the main semiconductor region formed thereon;
   (b) a substrate electrode connected to the substrate; and
   (c) a conductor electrically connecting the substrate electrode to the gate means of the main semiconductor switch.

9. A switching device as recited in claim 1, wherein the first and the second gate potential switches are a third and a fourth diode, respectively.

10. A switching device as recited in claim 9, wherein the main semiconductor switch and the third and the fourth diode are fabricated in the form of an integrated circuit chip.

11. A switching device as recited in claim 10, wherein the integrated circuit chip comprises:
   (a) a substrate;
   (b) a main semiconductor region formed on the substrate and electrically divided into a main switch section and a third and a fourth diode section;
   (c) the main switch section of the main semiconductor region having the first and the second main electrode and the gate means formed thereon for providing the main semiconductor switch;
   (d) the third diode section of the main semiconductor region having a first diode electrode in ohmic contact therewith and a second diode electrode in Schottky contact therewith for providing the third diode; and
   (e) the fourth diode section of the main semiconductor region having a third diode electrode in ohmic contact therewith and a fourth diode electrode in Schottky contact therewith for providing the fourth diode.

12. A switching device as recited in claim 11, wherein the substrate is of electroconductive material and is electrically coupled to the main semiconductor region, and wherein the switching device further comprises:
   (a) a first conductor electrically connecting the second diode electrode of the third diode to the substrate;
   (b) a second conductor electrically connecting the second diode electrode of the fourth diode to the substrate;
   (c) a substrate electrode to the substrate; and
   (d) a third conductor electrically connecting the gate means of the main semiconductor switch to the substrate electrode.

13. A switching device as recited in claim 1, wherein the main semiconductor switch is of semiconducting compound material, and wherein the first and the second auxiliary semiconductor switches are of semiconducting silicon material.

* * * * *